US012568743B2

(12) United States Patent
Kim

(10) Patent No.: US 12,568,743 B2
(45) Date of Patent: Mar. 3, 2026

(54) PIXEL AND DISPLAY DEVICE HAVING THE SAME

(71) Applicant: LG DISPLAY CO., LTD., Seoul (KR)

(72) Inventor: KyungMan Kim, Goyang-si (KR)

(73) Assignee: LG Display Co., Ltd

( * ) Notice: Subject to any disclaimer, the term of this patent is extended or adjusted under 35 U.S.C. 154(b) by 0 days.

(21) Appl. No.: 18/767,368

(22) Filed: Jul. 9, 2024

(65) Prior Publication Data

US 2025/0169299 A1 May 22, 2025

(30) Foreign Application Priority Data

Nov. 16, 2023 (KR) ........................ 10-2023-0158838

(51) Int. Cl.
| | |
|---|---|
| *H10K 59/131* | (2023.01) |
| *G09G 3/3233* | (2016.01) |
| *H10K 59/80* | (2023.01) |

(52) U.S. Cl.
CPC ......... *H10K 59/131* (2023.02); *G09G 3/3233* (2013.01); *H10K 59/80522* (2023.02); *G09G 2300/0426* (2013.01); *G09G 2300/0819* (2013.01); *G09G 2300/0842* (2013.01); *G09G 2300/0861* (2013.01); *G09G 2320/0223* (2013.01); *G09G 2330/025* (2013.01); *G09G 2330/04* (2013.01)

(58) Field of Classification Search
CPC .......... H10K 59/131; H10K 59/80522; G09G 3/3233; G09G 2300/0426; G09G 2300/0819; G09G 2300/0842; G09G 2300/0861; G09G 2320/0223; G09G 2330/025; G09G 2330/04
See application file for complete search history.

(56) References Cited

U.S. PATENT DOCUMENTS

| | | | | |
|---|---|---|---|---|
| 2014/0145181 A1* | 5/2014 | Yamazaki | ............ | H10D 86/441 |
| | | | | 257/773 |
| 2017/0004773 A1* | 1/2017 | Kim | ........................ | G09G 3/006 |
| 2017/0005084 A1* | 1/2017 | Zhou | ..................... | G09G 3/3208 |
| 2020/0372853 A1* | 11/2020 | Park | ..................... | G09G 3/3233 |

FOREIGN PATENT DOCUMENTS

KR 10-2016-0079476 A 7/2016

* cited by examiner

*Primary Examiner* — Stacy Khoo
(74) *Attorney, Agent, or Firm* — Fish & Richardson P.C.

(57) ABSTRACT

A pixel includes a light emitting diode which includes a first electrode and a second electrode, a driving transistor which is connected between a second node corresponding to the first electrode of the light emitting diode and a third node corresponding to a first power voltage line configured to supply a first power voltage and generates a driving current flowing to a second power voltage line configured to supply a second power voltage through the light emitting diode from the first power voltage line, a switching transistor which is connected between the first node corresponding to a gate electrode of the driving transistor and a data line and is turned on in response to a gate signal which is supplied to a gate line, a storage capacitor connected between the first node and the second node; and a protection circuit which is connected between the second electrode of the light emitting diode and the second power voltage line. Further, the protection circuit includes an auxiliary electrode and a protection transistor which are connected in series.

20 Claims, 9 Drawing Sheets

OPC_2(AL_1,PT_2)

PIXEL AND DISPLAY DEVICE HAVING THE SAME

CROSS-REFERENCE TO RELATED APPLICATION

This application claims the priority of Korean Patent Application No. 10-2023-0158838 filed on Nov. 16, 2023, which is hereby incorporated by reference in its entirety.

BACKGROUND

Field of the Disclosure

The present disclosure relates to a pixel and a display device including the same, and more particularly, to a pixel which suppresses overcurrent flowing in the pixel and a display device including the same.

Description of the Background

As it enters an information era, a display field which visually expresses electrical information signals has been rapidly developed, and in response to this, various display devices having excellent performances such as thin-thickness, light weight, and low power consumption have been developed. Examples of such a display device include a liquid crystal display (LCD) device and an organic light emitting display (OLED) device.

Such a display device includes a display panel in which pixels for displaying images are disposed and a driving circuit. The driving circuit includes a data driver configured to supply a data signal to the pixels through data lines, a gate driver configured to supply a gate signal to the pixels through gate lines, and a timing controller which controls the data driver and the gate driver.

SUMMARY

The present disclosure is to provide a pixel which minimizes a voltage drop for every display area and a display device including the same.

The present disclosure is also to provide a pixel which minimizes overcurrent in the pixel and resulting burnt defects and a display device including the same.

Further, the present disclosure is to provide a pixel which minimizes a luminance irregularity problem and a display device including the same.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a pixel includes a light emitting diode which includes a first electrode and a second electrode, a driving transistor which is connected between a second node corresponding to the first electrode of the light emitting diode and a third node corresponding to a first power voltage line configured to supply a first power voltage and generates a driving current flowing to a second power voltage line configured to supply a second power voltage through the light emitting diode from the first power voltage line, a switching transistor which is connected between the first node corresponding to a gate electrode of the driving transistor and a data line and is turned on in response to a gate signal which is supplied to a gate line, a storage capacitor connected between the first node and the second node; and a protection circuit which is connected between the second electrode of the light emitting diode and the second power voltage line. Further, the protection circuit includes an auxiliary electrode and a protection transistor which are connected in series.

In another aspect of the present disclosure, a display device includes a display panel including a plurality of pixels each connected to a data line, a gate line, a first power voltage line, and a second power voltage line; a gate driver configured to supply a gate signal to the gate line, a data driver configured to supply a data signal to the data line; and a power supply unit configured to supply a first power voltage to the first power voltage line and supplies a second power voltage to the second power voltage line. Each of the plurality of pixels may include: a light emitting diode which includes a first electrode and a second electrode, a driving transistor which is connected between a second node corresponding to the first electrode of the light emitting diode and a third node corresponding to the first power voltage line configured to supply a first power voltage and generates a driving current flowing to the second power voltage line configured to supply a second power voltage through the light emitting diode from the first power voltage line; a switching transistor which is connected between the first node corresponding to a gate electrode of the driving transistor and the data line and is turned on in response to the gate signal; a storage capacitor connected between the first node and the second node; and a protection circuit which is connected between the second electrode of the light emitting diode and the second power voltage line. Further, the protection circuit includes an auxiliary electrode and a protection transistor which are connected in series.

In a further aspect of the present disclosure, a display device includes a display area displaying an image and a non-display area located outside the display area and accommodating various signal lines or pads; a light emitting diode including a common electrode and disposed in the display area; a driving circuit connected to the light emitting diode; and a protection circuit configured to compensate for a deviation of a voltage drop for the display area and connected between the common electrode and a low potential power voltage line, wherein the protection circuit includes an auxiliary electrode and at least one protection transistor connected in series, and wherein the auxiliary electrode is connected between the common electrode and the second power voltage line, and the protection transistor is connected between the auxiliary electrode and the second power voltage line.

In the pixel and the display device including the same according to exemplary aspects of the present disclosure, the pixel may include a protection circuit (for example, an overcurrent protection circuit) connected (or coupled or disposed) between a light emitting diode and a power line (for example, a low potential voltage line) configured to supply a second power voltage (a low potential voltage).

Here, the protection circuit includes an auxiliary electrode (auxiliary line) which is connected between a second electrode (a cathode electrode) of a light emitting diode which is formed as a common electrode and a power line (for example, a low potential voltage line) configured to supply a second power voltage (a low potential voltage). The auxiliary electrode supplies a second power voltage (a low potential voltage) supplied from the power line (for example, a low potential voltage line) to the second electrode (cathode electrode) of the light emitting diode. Therefore, the voltage drop IR drop which may be generated according to a resistance of the second electrode (cathode electrode) of the light emitting diode which is formed as a common electrode is minimized (for example, removed) and thus the resulting luminance irregularity problem is solved.

Further, the protection circuit may further include a protection transistor which is connected to the auxiliary electrode in series. Therefore, the overcurrent which may occur according to an internal resistance difference of the auxiliary electrode and the resulting burnt defects may be suppressed.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
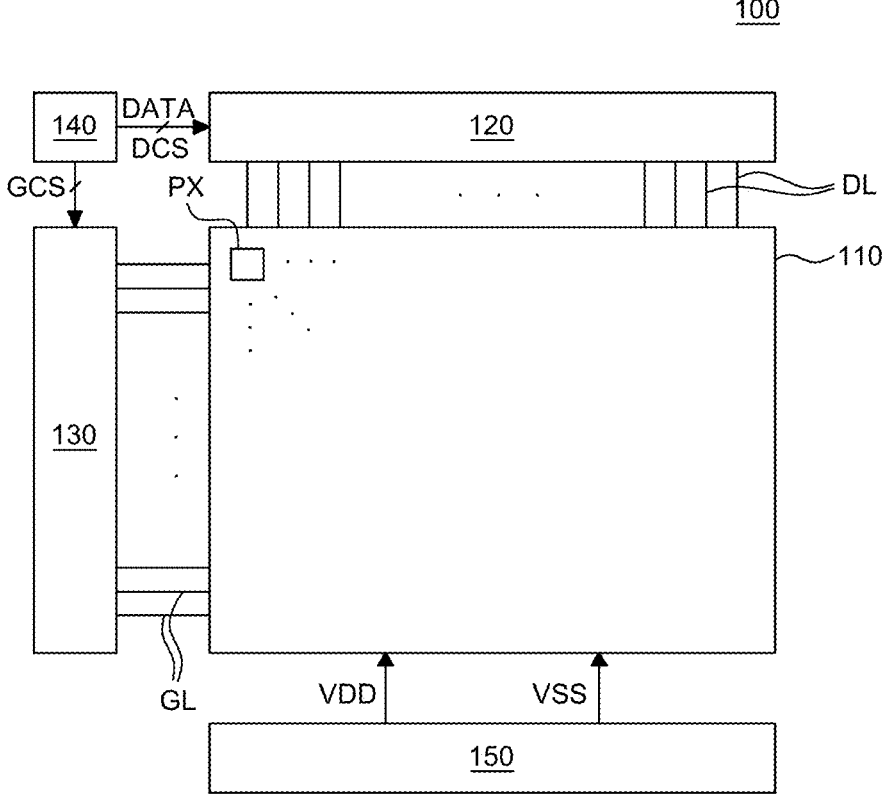
FIG. 1 is a block diagram illustrating a display device according to exemplary aspects of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the disclosure. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the disclosure.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

A transistor used for a display device according to exemplary aspects of the present disclosure may be implemented by any one transistor of n-channel transistors (NMOS) and p-channel transistors (PMOS). The transistor may be implemented by an oxide semiconductor transistor having an oxide semiconductor as an active layer or an LTPS transistor having a low temperature poly-silicon (LTPS) as an active layer. The transistor may include at least a gate electrode, a source electrode, and a drain electrode. The transistor may be implemented as a thin film transistor (TFT) on a display panel. In the transistor, carriers flow from the source electrode to the drain electrode. In the case of the n-channel transistor NMOS, since the carriers are electrons, to allow the electrons to flow from the source electrode to the drain electrode, a source voltage may be lower than a drain voltage. The current in the n-channel transistor NMOS flows from the drain electrode to the source electrode and the source electrode may serve as an output terminal. In the case of the p-channel transistor (PMOS), since the carriers are holes, to allow the holes to flow from the source electrode to the drain electrode, a source voltage is higher than a drain voltage. In the p-channel transistor PMOS, the holes flow from the source electrode to the drain electrode so that current flows from the source to the drain and the drain electrode serves as an output terminal. Accordingly, the source and the drain may be switched in accordance with the applied voltage so that it should be noted that the source and the drain of the transistor are not fixed. In the present disclosure, it is assumed that the transistor is a n-channel transistor NMOS, but is not limited thereto so that the p-channel transistor may be used and thus a circuit configuration may be changed.

A gate signal of transistors which are used as switching elements may swing between a gate-on voltage and a gate-off voltage. The gate-on voltage is set to be higher than a threshold voltage Vth of the transistor and the gate off voltage may be set to be lower than the threshold voltage Vth of the transistor. The transistor is turned on in response to the gate-on voltage and may be turned off in response to the gate-off voltage. In the case of the n-channel transistor NMOS, the gate-on voltage is a gate high voltage VGH and the gate-off voltage is a gate low voltage VGL. In the case of the p-channel transistor PMOS, the gate-on voltage is a gate low voltage VGL and the gate-off voltage may be a gate high voltage VGH.

Hereinafter, various exemplary aspects of the present disclosure will be described in detail with reference to accompanying drawings.

FIG. 1 is a block diagram illustrating a display device according to exemplary aspects of the present disclosure.

Referring to FIG. 1, a display device 100 according to exemplary aspects of the present disclosure may include a display panel 110, a data driver 120, a gate driver 130, a timing controller 140, and a power supply unit 150.

The display panel 110 (or a pixel unit or a display unit) may display an image. The display panel 110 may include various circuits, signal lines, and light emitting diodes disposed on the substrate. The display panel 110 may include a plurality of pixels PX which is divided by a plurality of data lines DL and a plurality of gate lines GL intersecting each other and is connected to the plurality of data lines DL and the plurality of gate lines GL.

The display panel 110 may include a display area in which an image is displayed and a non-display area in which various signal lines or pads are formed. The non-display area is located at the outside of the display area. The display panel 110 may be implemented by a display panel used in various display devices, such as a liquid crystal display device, an organic light emitting display device, or an electrophoretic display device. Hereinafter, it is described that the display panel 110 is a panel used in the organic light emitting display device, but the exemplary aspect of the present disclosure is not limited thereto.

The display panel 110 may include a plurality of pixels PX disposed on the display area. Each of the plurality of pixels PX may be electrically connected to a corresponding gate line GL, among gate lines GL, and a corresponding data line DL, among data lines DL. Therefore, a gate signal and a data signal may be applied to each pixel PX, through the gate line GL and the data line DL. Each pixel PX may emit light with a luminance corresponding to the data signal supplied through the corresponding data line DL in response to the gate signal supplied through the corresponding gate line GL. Therefore, each pixel PX may implement the gray scale by the applied gate signal and data signal and finally, the image may be displayed in the display area by the gray scales displayed by the pixels PX.

In the meantime, pixels PX may be supplied with a first power voltage VDD (for example, a high potential power voltage) and a second power voltage VSS (for example, a low potential power voltage) from the power supply unit 150. Here, the first power voltage VDD and the second power voltage VSS are voltages required for the operation of the pixels PX. For example, the first power voltage VDD may have a voltage level higher than a voltage level of the second power voltage VSS.

The timing controller 140 (or a timing control circuit) may receive timing signals, such as a vertical synchronization signal, a horizontal synchronization signal, a data enable signal, or a dot clock by means of a receiving circuit such as an LVDS or TMDS interface connected to the outside (for example, a host system).

The timing controller 140 may generate and output control signals based on the input timing signal to control the data driver 120 and the gate driver 130. For example, the timing controller 140 generates a data control signal DCS for controlling the data driver 120, to supply the data control signal to the data driver 120 and generates a gate control signal GCS for controlling the gate driver 130 to supply the gate control signal to the gate driver 130, based on the input timing signals.

Further, the timing controller 140 realigns image data DATA input through a reception circuit, such as an LVDS or TMDS interface, connected to the outside (for example, a host system) to supply the image data to the data driver 120.

The data driver 120 (or a data driving circuit) may supply a data signal to the plurality of pixels PX. To this end, the data driver 120 may include at least one source drive IC (integrated circuit). The source drive IC is supplied with the image data DATA and the data control signal DCS from the timing controller 140 and converts the image data DATA into a gamma voltage in response to the image data DATA and the data control signal DCS and may supply the data signal to the pixels PX through the data line DL of the display panel 110. The source drive IC may be connected to the data line DL of the display panel 110 by a chip on glass (COG) process or a tape automated bonding (TAB) process. Further, the source drive IC is formed on the display panel 110 or may be formed on a separate PCB substrate to be connected to the display panel 110.

The gate driver 130 (or a gate driving circuit, a scan driver, or a scan driving circuit) may supply a gate signal to the plurality of pixels PX. The gate driver 130 may include a level shifter and a shift register. The level shifter shifts a level of a clock signal input at a transistor-transistor-logic (TTL) level from the timing controller 140 and then may supply the clock signal to the shift register. The shift register may be formed in the non-display area of the display panel 110, by a GIP manner, but is not limited thereto. The shift register may be configured by a plurality of stages which shifts and outputs the gate signal, in response to the clock signal and the driving signal. The plurality of stages included in the shift register may sequentially output the gate signal through a plurality of output terminals.

The power supply unit 150 may supply the first power voltage VDD and the second power voltage VSS for driving the pixel PX to the display panel 110. A voltage level of the second power voltage VSS may be lower than a voltage level of the first power voltage VDD. For example, the first power voltage VDD is a positive voltage and the second power voltage VSS is a negative voltage.

Figure 2:
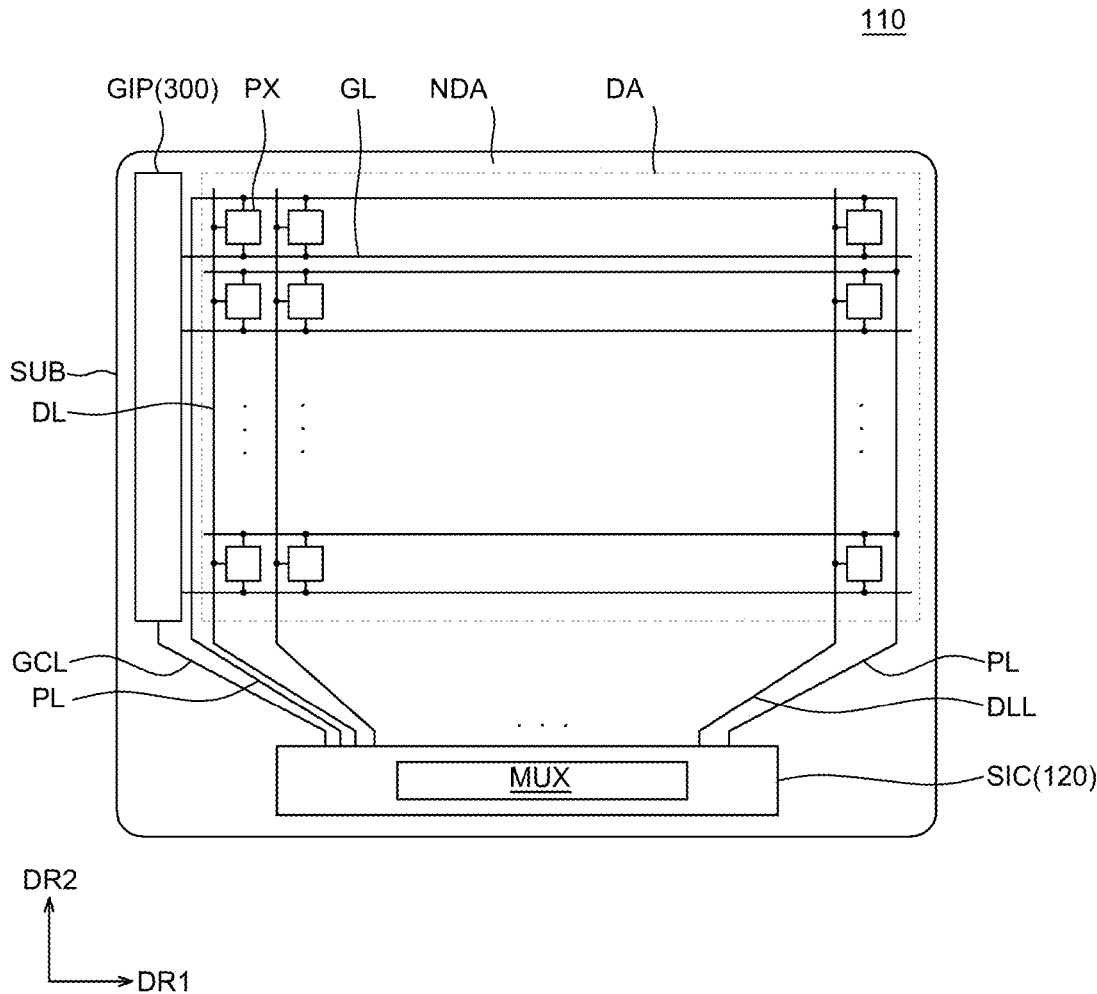
FIG. 2 is a plan view illustrating an example of a display panel included in a display device of FIG. 1.

FIG. 2 is a plan view illustrating an example of a display panel included in a display device of FIG. 1.

Referring to FIGS. 1 and 2, the display panel 110 may include a substrate SUB (for example, a lower substrate). Further, the display panel 110 may include a plurality of pixels PX, a plurality of gate lines GL, a plurality of data lines DL, a power line PL, a gate control line GCL, a gate driver GIP, a source driving integrated circuit SCI, and a data connection line DLL disposed on the substrate SUB (for example, a lower substrate).

As described with reference to FIG. 1, the display panel 110 may include a display area DA in which images are displayed and a non-display area NDA.

The display area DA may be parallel to a surface defined by a first directional axis (for example, an axis extending in the first direction DR1) and a second directional axis (for example, an axis extending in the second direction DR2).

In the meantime, in FIG. 2, even though it is illustrated that the display panel 110 has a rounded corner at which one long side and one short side intersect, this is just illustrative and the shape of the display panel 110 is not limited thereto. For example, the display panel 110 may have an angled shape at the corner in which one long side and one short side intersect.

In one exemplary aspect, the display panel 110 may include a flat display area DA, but is not limited thereto. For example, the display panel 110 may include a curved display area or a three-dimensional display area.

A plurality of pixels PX may be disposed on the display area DA. Each of the pixels PX may be connected to a corresponding gate line GL, among gate lines GL, a corresponding data line DL, among data lines DL, and a power line PL. Here, the power line PL may be a second power voltage line (for example, a low potential voltage line) to be supplied with the second power voltage VSS (for example, a low potential power voltage) which has been described with reference to FIG. 1.

According to the exemplary aspect, each of the pixels PX may include a driving transistor, at least one switching transistor, a light emitting diode, and a storage capacitor.

The gate lines GL, the data lines DL, and the power line PL may be disposed on the display panel 110.

In one exemplary aspect, the gate lines GL extend in the first direction DR1 and the data lines DL may extend in the second direction DR2.

The power line PL may include at least one main line extending in the second direction DR2 and a plurality of sub lines which is branched in the first direction DR1 from at least one main line. In one exemplary aspect, the power line PL may include two main lines each extending to the second direction DR2 on the non-display areas NDA on both sides of the display area DA and a plurality of sub lines branched to the first direction DR1 from two main lines.

In one exemplary aspect, the source driving integrated circuit SIC, the gate driver GIP, the gate control line GCL, and the data connection line DLL may further be disposed on the display panel 110. The source driving integrated circuit SIC, the gate driver GIP, the gate control line GCL, and the data connection line DLL may be disposed on the non-display area NDA.

In the meantime, in FIG. 2, even though it is illustrated that the gate driver GIP is disposed on the non-display area NDA corresponding to one side of the display area DA, this is just illustrative and the exemplary aspect of the present disclosure is not limited thereto. For example, two gate drivers GIP may be disposed on the non-display areas NDA corresponding to both sides of the display area DA.

In the meantime, the gate driver GIP of FIG. 2 may be substantially the same as or similar to the gate driver 130 which has been described with reference to FIG. 1.

The source driving integrated circuit SIC may supply a data signal to the data lines DL through the data connection line DLL. Further, the source driving integrated circuit SIC generates a gate control signal for controlling the gate driver GIP through the gate control line GCL to supply the gate control signal to the gate driver GIP.

In one exemplary aspect, the source driving integrated circuit SIC is configured by an integrated circuit IC to be attached onto the substrate SUB by a chip on glass (COG) manner, a chip on plastic (COP) manner, or an ultrasonic bonding manner.

In the meantime, the source driving integrated circuit SIC of FIG. 2 may be one integrated circuit which is configured by the data driver 120 which has been described with reference to FIG. 1.

Hereinafter, a driving circuit (pixel circuit) for driving one pixel PX will be described in more detail further with reference to FIG. 3.

Figure 3:
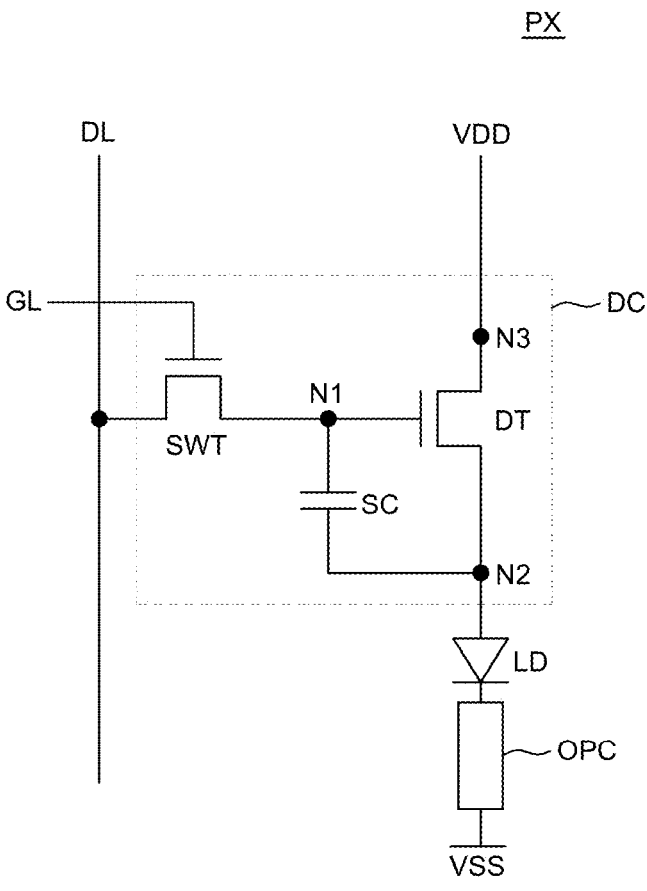
FIG. 3 is a circuit diagram illustrating an example of a pixel included in a display device of FIG. 1.

FIG. 3 is a circuit diagram illustrating an example of a pixel included in a display device of FIG. 1.

Referring to FIG. 3, the pixel PX may include a light emitting diode LD and a driving circuit DC which is connected thereto to drive the light emitting diode LD. In one exemplary aspect, the pixel PX may further include a protection circuit OPC (for example, an overcurrent protection circuit) connected (or coupled or disposed) between the light emitting diode LD and a power line (for example, a low potential voltage line) configured to supply a second power voltage VSS.

A first electrode (for example, an anode electrode) of the light emitting diode LD may be connected to the first power voltage VDD via the driving circuit DC and a second electrode (for example, a cathode electrode) of the light emitting diode LD may be connected to the second power voltage VSS via the protection circuit OPC. The light emitting diode LD may emit light with a luminance corresponding to a driving current amount controlled by the driving circuit DC.

The light emitting diode LD may be configured as an organic light emitting diode. The light emitting diode LD may include an anode, an emission layer, and a cathode. For example, the emission layer may be an organic layer and the organic layer may include various organic layers such as a hole injection layer, a hole transport layer, an organic emission layer, an electron transport layer, and an electron injection layer.

In the meantime, even though in FIG. 3, it is described that the light emitting diode LD is an organic light emitting diode as a basic example, the exemplary aspect of the present disclosure is not limited thereto. In another exemplary aspect, the light emitting diode LD may be configured as an inorganic light emitting diode, such as a micro light emitting diode (LED) or a quantum dot light emitting diode. Further, the light emitting diode LD may be a light emitting diode in which an organic material and an inorganic material are mixed.

In the meantime, even though in FIG. 3, it is illustrated that the pixel PX includes a single light emitting diode LD, according to another exemplary aspect, the pixel PX includes a plurality of light emitting diodes LD and the plurality of light emitting diodes LD may be connected in series, parallel, or serial-parallel.

According to the exemplary aspect, the first electrode (for example, an anode electrode) of the light emitting diode LD is independently formed in every pixel, but the second electrode (for example, a cathode electrode) of the light emitting diode LD may be formed as a common electrode. For example, the plurality of pixels, for example, the light emitting diodes LD included in each of the plurality of pixels PX may share the second electrode (for example, a cathode electrode) which is formed as a common electrode. Therefore, the first electrode (for example, an anode electrode) of the light emitting diode LD is independently formed in every pixel to be electrically connected to the driving circuit DC of the corresponding pixel. Further, the light emitting diodes LD included in each of the plurality of pixels PX share the second electrode (for example, a cathode electrode) formed as a common electrode to be supplied with a second power voltage VSS through the common electrode.

The first power voltage VDD and the second power voltage VSS may have different voltage levels (or potentials). For example, a voltage level of the first power voltage VDD may be higher than a voltage level of the second power voltage VSS. For example, the first power voltage VDD is a positive voltage and the second power voltage VSS may be a negative voltage.

The driving circuit DC may include a driving transistor DT, a switching transistor SWT, and a storage capacitor SC.

The driving transistor DT (or the first transistor) may include a gate electrode connected to the first node N1, a drain electrode (or a first electrode) connected to a third node N3, and a source electrode (or a second electrode) connected to a second node N2. The first node N1 to which the gate electrode of the driving transistor DT is connected is connected to the switching transistor SWT. The third node N3 to which the drain electrode is connected is connected to the first power voltage line (for example, a high potential voltage line) to be applied with a first power voltage (for example, a high potential voltage). The second node N2 to which the source electrode is connected may be connected to the first electrode (for example, an anode) of the light emitting diode LD.

The driving transistor DT supplies a driving current to the light emitting diode LD to allow the light emitting diode LD to emit light. For example, the driving transistor DT may control a driving current amount supplied to the light emitting diode LD in response to a data signal supplied to the first node N1 through the data line DL.

The switching transistor SWT may include a gate electrode connected to the gate line GL, a drain electrode (or the first electrode) connected to the data line DL, and a source electrode (or the second electrode) connected to the gate electrode of the driving transistor DT (or the first node N1).

The switching transistor SWT (or the second transistor) may transmit the data signal (or a data voltage) to the gate electrode of the driving transistor DT (or the first node N1). For example, the switching transistor SWT is turned on by the gate signal (or a scan signal) supplied from the gate line GL to electrically connect the data line DL and the first node N1. In this case, the switching transistor SWT may transmit a data signal (or a data voltage) supplied from the data line DL to the gate electrode of the driving transistor DT (or the first node N1). At this time, a data signal of a corresponding frame is supplied to the data line DL so that the data signal is transmitted to the first node N1. Further, a voltage corresponding to the data signal transmitted to the first node N1 may be stored in the storage capacitor SC.

One electrode of the storage capacitor SC is connected to the first node N1 and the other electrode may be connected to the second node N2. That is, the storage capacitor SC may be connected between the gate electrode and the source electrode of the driving transistor DT.

The storage capacitor SC may maintain a voltage (data voltage) corresponding to the data signal for one frame. For example, the storage capacitor SC may be charged with a voltage corresponding to the data signal supplied to the first node N1 and maintain the charged voltage until a data signal of a next frame is supplied.

In the meantime, in FIG. 3, a pixel PX with a relatively simple structure is illustrated for the convenience of description, and the structure of the driving circuit DC may be changed in various forms. For example, the driving circuit DC may further include various transistors or other circuit elements. Various transistors include a compensation transistor for compensating for a threshold voltage of the driving transistor DT, an initialization transistor for initializing the first node N1, for example, the gate electrode of the driving transistor DT, and/or an emission control transistor for controlling an emission time of the light emitting diode LD. Other circuit elements may include a boosting capacitor for boosting a voltage of the first node N1, for example, the gate electrode of the driving transistor DT.

Further, in FIG. 3, even though it is illustrated that all the transistors included in the driving circuit DC, for example, the driving transistor DT and the switching transistor SWT are N-type transistors, the exemplary aspect of the present disclosure is not limited thereto. That is, at least one of the transistors included in the driving circuit DC, for example, the driving transistor DT and the switching transistor SWT may be changed to a P-type transistor.

In the meantime, as described above, when the light emitting diodes LD included in each of the plurality of pixels PX share the second electrode (for example, a cathode electrode) as a common electrode to be supplied with the second power voltage VSS, there may be voltage drop (IR drop) according to a resistance of the second electrode which is a common electrode. Therefore, this may lead to the luminance irregularity issue.

For example, as described with reference to FIGS. 1 and 2, the power line PL (for example, at least one main line of the power line PL which has been described with reference to FIGS. 1 and 2) extends to the second direction DR2 on the non-display area NDA of at least one side of the display area DA to be electrically connected to the common electrode. Therefore, the second power voltage VSS may be supplied to the pixel PX. Therefore, the voltage drop (IR drop) may vary for every position of the display area DA according to the resistance of the second electrode which is a common electrode. For example, in a pixel which is disposed to be the most adjacent to at least one main line of the power line PL disposed on the non-display area NDA, among the plurality of pixels PX, the voltage drop (IR drop) is relatively small. In contrast, in a pixel which is disposed to be farther from at least one main line of the power line PL disposed on the non-display area NDA, among the plurality of pixels PX, the voltage drop (IR drop) may be relatively large.

Figure 4A:
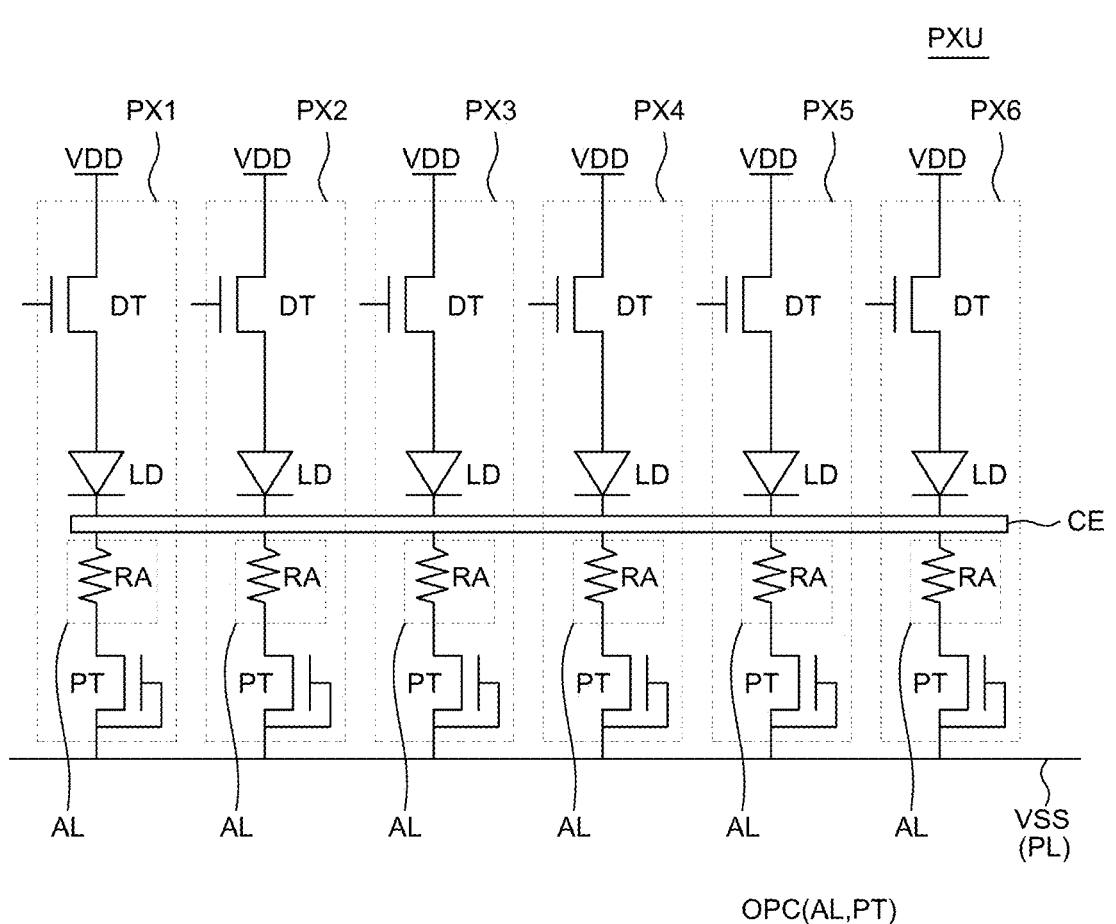
FIGS. 4A and 4B are circuit diagrams illustrating a pixel group according to exemplary aspects of the present disclosure.

To compensate for the deviation of the voltage drop (IR drop) for every display area DA, each pixel PX may further include an auxiliary electrode (for example, an auxiliary electrode AL of FIG. 4A). The auxiliary electrode is electrically connected to the second electrode (for example, a cathode electrode) of the light emitting diode LD, that is, a second electrode provided as a common electrode. Here, the auxiliary electrode is electrically connected to a sub line which is branched in the first direction DR1 from at least one main line extending in the second direction DR2 of the power line PL which has been described with reference to FIGS. 1 and 2 to be supplied with the second power voltage VSS. Further, the auxiliary electrode transmits the second power voltage VSS to the second electrode (for example, a cathode electrode) of the light emitting diode LD.

However, in this case, the auxiliary electrode is formed for every pixel PX so that an internal resistance of the auxiliary electrode may vary in every pixel PX. Therefore, overcurrent flows in a current path of an auxiliary electrode having a relatively low internal resistance, among the auxiliary electrodes, so that a burnt defect may occur in the auxiliary electrode according to the Joule heating. In this case, the resistance on the current path of the auxiliary electrode is increased to cause a poor image quality.

Therefore, the protection circuit OPC included in the pixel PX according to the exemplary aspects of the present disclosure may include an auxiliary electrode (for example, an auxiliary electrode AL of FIG. 4A) and at least one protection transistor (for example, a protection transistor PT of FIG. 4A). The auxiliary electrode compensates for a deviation of the voltage drop (IR drop) for every display area DA and at least one protection transistor is connected (or coupled or disposed) between the auxiliary electrode and the power line PL which transmits the second power voltage VSS. Accordingly, even though there is an auxiliary electrode having a relatively low internal resistance, among the auxiliary electrodes, overcurrent flowing in the current path according to at least one protection transistor and the burnt defect of the auxiliary electrode may be suppressed. Therefore, the image quality of the displayed image may be improved.

Hereinafter, the protection circuit OPC for suppressing the deviation of the voltage drop (IR drop) for every display area DA and the overcurrent which generates in the corresponding current path in the exemplary aspect of the present disclosure will be described in more detail with reference to FIGS. 5A to 6B.

Figure 4B:
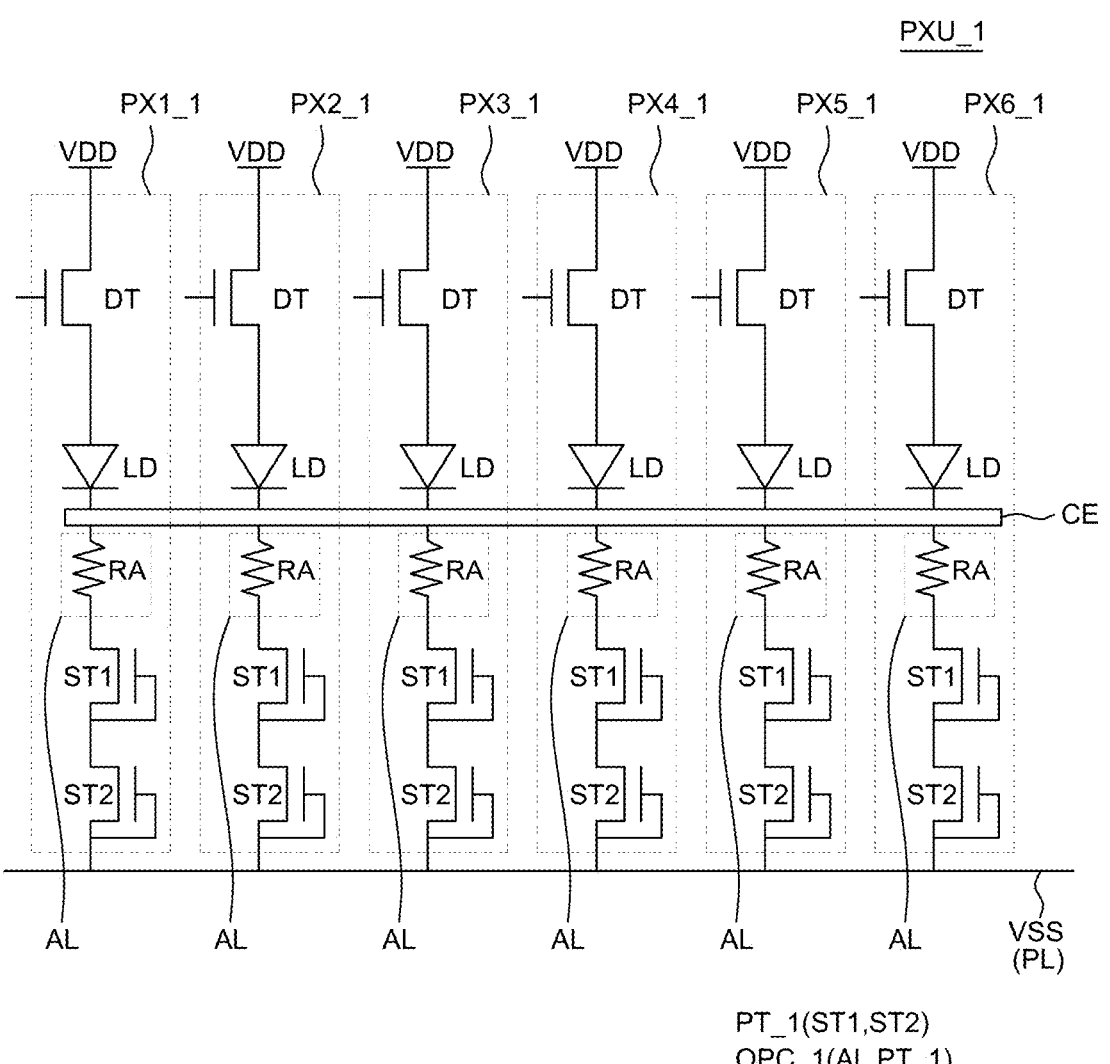

FIGS. 4A and 4B are circuit diagrams illustrating a pixel group according to exemplary aspects of the present disclosure.

In the meantime, to avoid redundant description, in FIGS. 4A and 4B, contents which do not overlap the description with reference to FIGS. 1 to 3 will be mainly described. A part which is not specifically described follows the above-described exemplary aspect and the same reference numeral denotes the same component and the like reference numeral denotes the like component.

First, referring to FIG. 4A, in FIG. 4A, six pixels (for example, first to sixth pixels PX1 to PX6), among pixels according to the exemplary aspects of the present disclosure are illustrated as an example and for convenience of description, the first to sixth pixels PX1 to PX6 are defined as a pixel group PXU.

In the meantime, for the convenience of description, in FIG. 4A, only a driving transistor DT, a light emitting diode LD, a common electrode CE, an auxiliary electrode AL, and a protection transistor PT, among configurations included in each of the first to sixth pixels PX1 to PX6, are illustrated.

Referring to FIGS. 1, 2, 3, and 4A, the pixel group PXU according to the exemplary aspects of the present disclosure includes first to sixth pixels PX1 to PX6 and each of the first to sixth pixels PX1 to PX6 may include a driving transistor DT, a light emitting diode LD, a common electrode CE, and a protection circuit OPC.

As described above, the light emitting diode LD included in each of the first to sixth pixels PX1 to PX6 may share the common electrode CE as a second electrode (for example, a cathode electrode). For example, at least a part of the common electrode CE may configure a second electrode (for example, a cathode electrode) of the light emitting diode LD included in each pixel PX1 to PX6.

The protection circuit OPC may be connected (or coupled or disposed) between the common electrode CE and the power line PL (for example, a low potential voltage line) configured to supply a second power voltage VSS (for example, a low potential voltage).

The protection circuit OPC may suppress the deviation of the voltage drop (IR drop) of the second power voltage VSS supplied to each of the pixels PX1 to PX6 which is caused by sharing the common electrode CE by the light emitting diode LD and overcurrent which may be generated on the current path through which the driving current of each pixel PX1 to PX6 flows.

To this end, in one exemplary aspect, the protection circuit OPC may include an auxiliary electrode AL and a protection transistor PT which is connected to the auxiliary electrode AL in series.

The auxiliary electrode AL (or an auxiliary line) may be connected (or coupled or disposed) between the second electrode of the light emitting diode LD, for example, a common electrode CE and the power line PL. For example, one end of the auxiliary electrode AL is connected to the second electrode (for example, a common electrode CE) of the light emitting diode LD and the other end of the auxiliary electrode AL may be connected to the power line PL via the protection transistor PT.

The auxiliary electrode AL may be provided with a material having a high conductivity, such as metal or conductive oxide. For example, the auxiliary electrode AL may be formed by a single layer or a multilayer including aluminum (Al), copper (Cu), or titanium (Ti). In some exemplary aspect, the auxiliary electrode AL may be provided as a triple layer of titanium, aluminum, and titanium (Ti/Al/Ti) which are sequentially disposed. However, the auxiliary electrode AL is not limited thereto and may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof.

As described above, each pixel PX1 to PX6 (for example, the protection circuit OPC) includes an auxiliary electrode AL to minimize (for example, remove) a deviation of voltage drop (IR drop) for every display area DA which may be caused by sharing the common electrode CE by the above-described light emitting diodes LD. The auxiliary electrode is connected between the common electrode CE and the power line PL to supply a second power voltage VSS supplied from the power line PL to the common electrode CE, that is, the second electrode (for example, a cathode electrode) of the light emitting diode LD.

However, as described above, the auxiliary electrode AL is formed for every pixel PX1 to PX6 so that an internal resistance RA of the auxiliary electrode AL may be different for every pixel PX1 to PX6. Therefore, an overcurrent may flow on the current path of an auxiliary electrode AL having a relatively low internal resistance RA, among the auxiliary electrodes AL, so that problems such as burnt defect and a poor image quality may be generated in the corresponding auxiliary electrode AL according to the Joule heating. Therefore, to suppress the problem such as the burnt defect and the poor image quality, the protection circuit OPC according to the exemplary aspect of the present disclosure may include a protection transistor PT connected (or coupled or disposed) between the auxiliary electrode AL and the power line PL.

In the exemplary aspect, the protection transistor PT may be connected between the auxiliary electrode AL and the power line PL in series. For example, a first electrode (for example, a drain electrode) of the protection transistor PT is connected to the auxiliary electrode AL and the second electrode (for example, a source electrode) may be connected to the power line PL.

As described above, the protection transistor PT is connected between the auxiliary electrode AL and the power line PL in series. Therefore, even though there is an auxiliary electrode AL having a relatively low internal resistance RA, among the auxiliary electrodes AL included in the pixels PX1 to PX6, a total resistance of the current path (for example, a current path of the driving current flowing in the light emitting diode LD) is increased according to the protection transistor PT connected between the auxiliary electrode AL and the power line PL in series. Therefore, the overcurrent may be suppressed from flowing in the corresponding current path.

Further, in the exemplary aspect, the protection transistor PT may be diode-connected between the auxiliary electrode AL and the power line PL. For example, the gate electrode of the protection transistor PT may be connected to the second electrode (for example, a source electrode). Therefore, the protection transistor PT always operates in a saturated area so that a current path of the driving current which flows from the high potential voltage line configured to supply the first power voltage VDD (for example, a high potential power voltage) in the corresponding pixel PX1 to PX6 to the low potential voltage line (for example, the power line PL) configured to supply the second power voltage VSS (for example, a low potential power voltage) via the driving transistor DT and the light emitting diode LD may be ensured.

In the meantime, even though in FIG. 4A, it is illustrated that the protection transistors PT are N-type transistors, the exemplary aspect of the present disclosure is not limited thereto. That is, the protection transistors PT may be changed to the P-type transistors.

In the meantime, even though in FIG. 4A, it is described that the protection circuit OPC includes one protection transistor PT as a basic example, the exemplary aspect of the present disclosure is not limited thereto.

For example, further referring to FIG. 4B, in FIG. 4B, six pixels (for example, first to sixth pixels PX1_1 to PX6_1), among pixels according to the exemplary aspects of the present disclosure, are illustrated. For the convenience of description, hereinafter, the first to sixth pixels PX1_1 to PX6_1 are defined as a pixel group PXU_1.

In the meantime, for the convenience of description, in FIG. 4B, only a driving transistor DT, a light emitting diode LD, a common electrode CE, an auxiliary electrode AL, and a protection transistor PT_1, among configurations included in each of the first to sixth pixels PX1_1 to PX6_1, are illustrated.

Referring to FIGS. 1, 2, 3, and 4B, the pixel group PXU_1 according to the exemplary aspects of the present disclosure includes first to sixth pixels PX1_1 to PX6_1 and each of the first to sixth pixels PX1_1 to PX6_1 may include a driving transistor DT, a light emitting diode LD, a common electrode CE, and a protection circuit OPC_1.

The protection circuit OPC_1 may be connected (or coupled or disposed) between the common electrode CE and the power line PL (for example, a low potential voltage line) configured to supply a second power voltage VSS (for example, a low potential voltage). The protection circuit OPC_1 may include an auxiliary electrode AL and the protection transistor PT_1 which is connected to the auxiliary electrode AL in series. For example, the protection transistor PT_1 may be connected (for example, connected in series) between the auxiliary electrode AL and the power line PL.

In the exemplary aspect, the protection transistor PT_1 may include two sub protection transistors ST1 and ST2 which are connected to each other in series. For example, the first sub protection transistor ST1 is connected between the auxiliary electrode AL and the second sub protection transistor ST2 in series and the second sub protection transistor ST2 may be connected between the first sub protection transistor ST1 and the power line PL in series. For example, a first electrode (for example, a drain electrode) of the first sub protection transistor ST1 is connected to the auxiliary electrode AL and a second electrode (for example, a source electrode) of the first sub protection transistor ST1 is connected to a first electrode (for example, a drain electrode) of the second sub protection transistor ST2. A second electrode (for example, a source electrode) of the second sub protection transistor ST2 may be connected to the power line PL.

Further, in one exemplary aspect, two sub protection transistors ST1 and ST2 which are included in the protection transistor PT_1 and are connected in series may be diode-connected.

As described above, the protection circuit OPC includes two sub protection transistors ST1 and ST2 which are connected in series so that the overcurrent which may be generated in the corresponding current path may be effectively suppressed.

In the meantime, even though in FIG. 4B, it is described that the protection transistor PT_1 includes two serially-connected sub protection transistors ST1 and ST2 as a basic example, the exemplary aspect of the present disclosure is not limited thereto. Therefore, the protection transistor PT_1 may be configured to include three or more serially connected sub protection transistors.

In the meantime, even though in FIG. 4B, it is illustrated that the protection transistor PT_1, for example, both the sub protection transistors ST1 and ST2 are N-type transistors, the exemplary aspect of the present disclosure is not limited thereto. That is, at least one of the sub protection transistors ST1 and ST2 of the protection transistor PT_1 may be changed to a P-type transistor.

Figure 5A:
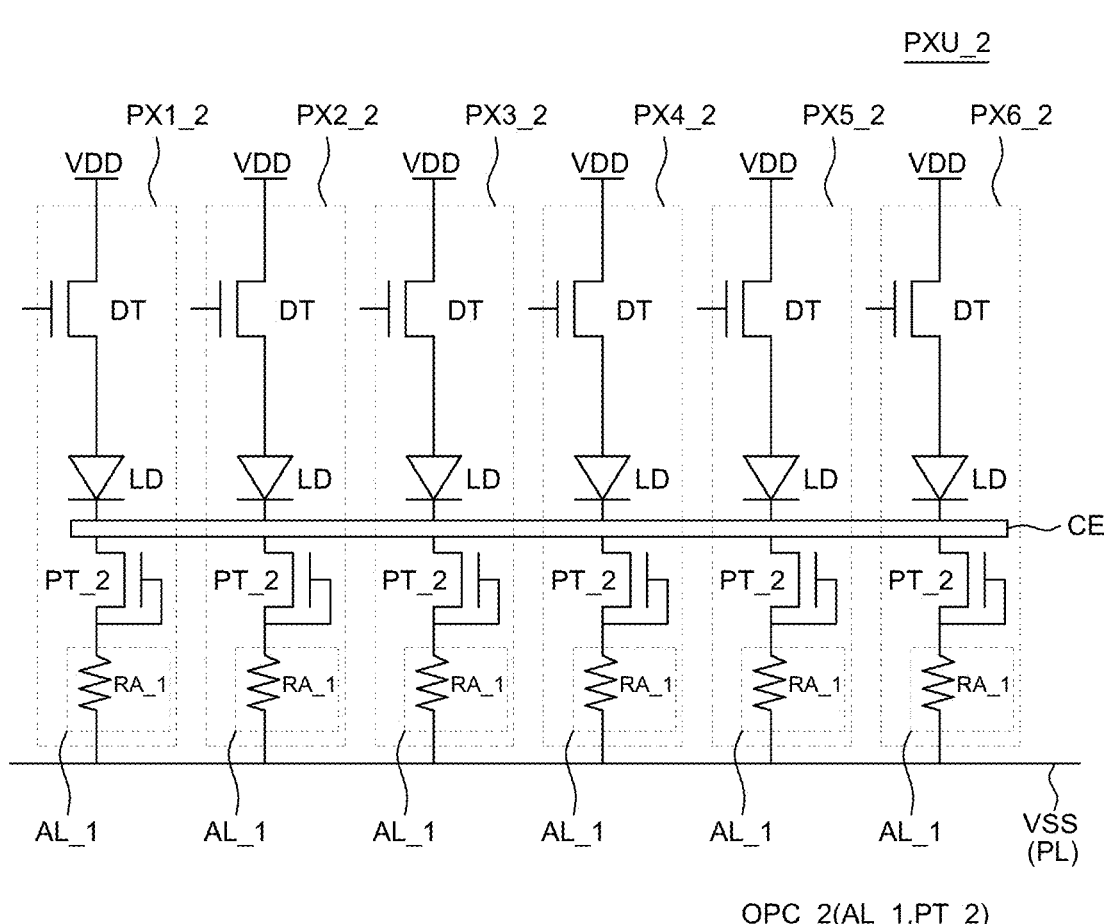
FIGS. 5A and 5B are circuit diagrams illustrating a pixel group according to exemplary aspects of the present disclosure.
Figure 5B:
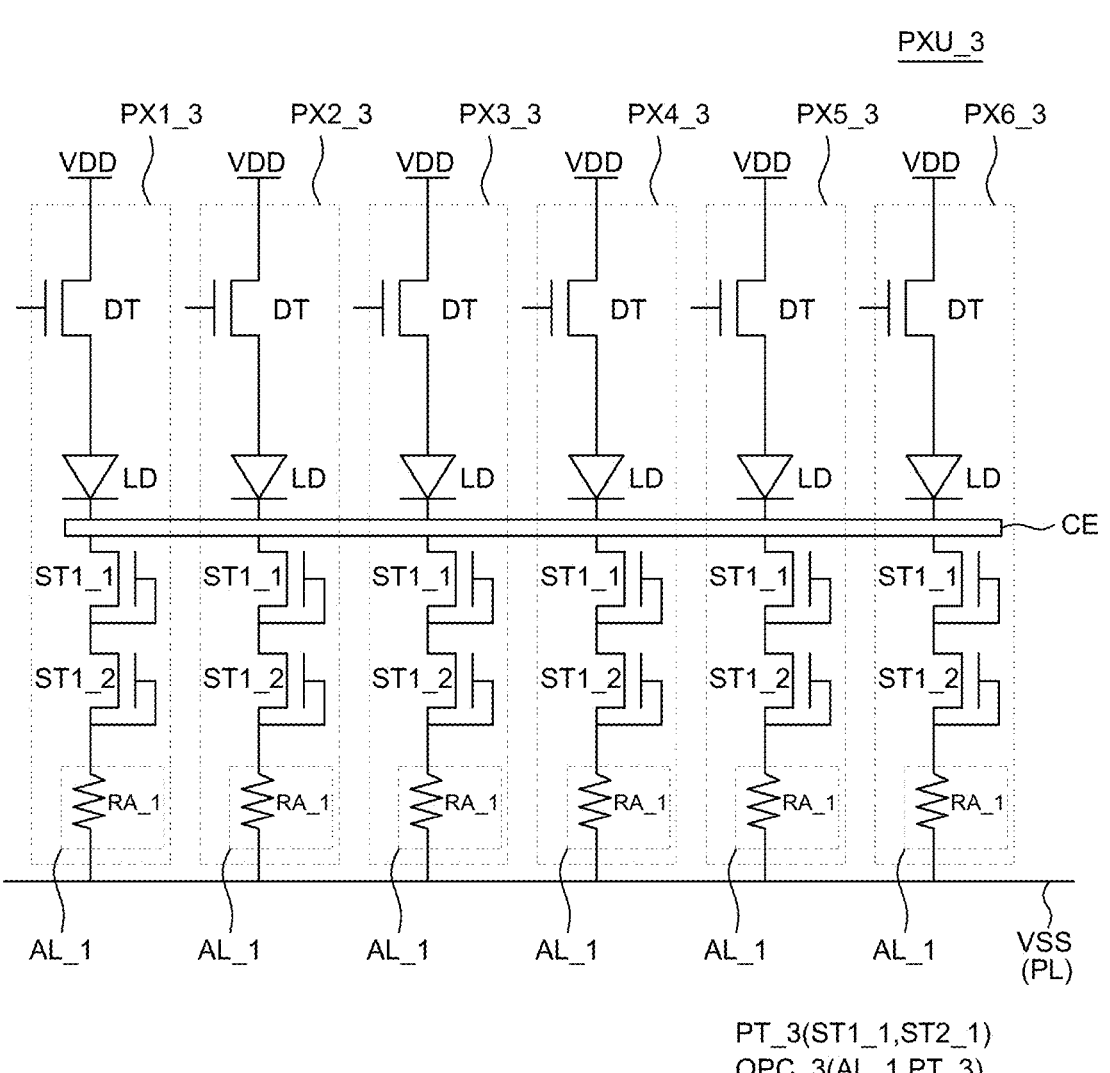

FIGS. 5A and 5B are circuit diagrams illustrating a pixel group according to exemplary aspects of the present disclosure.

FIGS. 5A and 5B illustrate a modified exemplary aspect for the exemplary aspect of FIGS. 4A and 4B with regard to the placement order (a connection order) of the auxiliary electrode AL_1 and the protection transistors PT_2 and PT_3.

In the meantime, to avoid redundant description, in FIGS. 5A and 5B, contents which do not overlap the description with reference to FIGS. 1 to 3 will be mainly described. A part which is not specifically described follows the above-described exemplary aspect and the same reference numeral denotes the same component and the like reference numeral denotes the like component.

First, referring to FIG. 5A, in FIG. 5A, six pixels (for example, first to sixth pixels PX1_2 to PX6_2, among pixels according to the exemplary aspects of the present disclosure, are illustrated and for convenience of description, the first to sixth pixels PX1_2 to PX6_2 are defined as a pixel group PXU_2.

In the meantime, for the convenience of description, in FIG. 5A, only a driving transistor DT, a light emitting diode LD, a common electrode CE, an auxiliary electrode AL_1, and a protection transistor PT_2, among configurations included in each of the first to sixth pixels PX1_2 to PX6_2, are illustrated.

Referring to FIGS. 1, 2, 3, and 5A, the pixel group PXU_2 according to the exemplary aspects of the present disclosure includes first to sixth pixels PX1_2 to PX6_2 and each of the first to sixth pixels PX1_2 to PX6_2 may include a driving transistor DT, a light emitting diode LD, a common electrode CE, and a protection circuit OPC_2.

As described above, the light emitting diode LD included in each of the first to sixth pixels PX1_2 to PX6_2 may share the common electrode CE as a second electrode (for example, a cathode electrode). For example, at least a part of the common electrode CE may configure a second electrode (for example, a cathode electrode) of the light emitting diode LD included in each pixel PX1_2 to PX6_2.

The protection circuit OPC_2 may be connected (or coupled or disposed) between the common electrode CE and the power line PL (for example, a low potential voltage line) configured to supply a second power voltage VSS (for example, a low potential voltage).

In one exemplary aspect, the protection circuit OPC_2 may include an auxiliary electrode AL_1 and a protection transistor PT_2 which is connected to the auxiliary electrode AL_1 in series.

The auxiliary electrode AL_1 (or an auxiliary line) may be connected (or coupled or disposed) between the second electrode of the light emitting diode LD, for example, a common electrode CE and the power line PL. For example, one end of the auxiliary electrode AL_1 is connected to the second electrode (for example, a common electrode CE) of the light emitting diode LD via the protection transistor PT_2 and the other end of the auxiliary electrode AL_1 may be connected to the power line PL.

The auxiliary electrode AL_1 may be provided with a material having a high conductivity, such as metal or conductive oxide. For example, the auxiliary electrode AL_1 may be formed by a single layer or a multilayer including aluminum (Al), copper (Cu), or titanium (Ti). In some exemplary aspect, the auxiliary electrode AL_1 may be provided as a triple layer of titanium, aluminum, and titanium (Ti/Al/Ti) which are sequentially disposed. However, the auxiliary electrode AL_1 is not limited thereto and may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof.

As described above, each pixel PX1_2 to PX6_2 (for example, the protection circuit OPC_2) includes an auxiliary electrode AL_1 to minimize (for example, remove) a deviation of voltage drop (IR drop) for every display area DA which may be caused by sharing the common electrode CE by the light emitting diodes LD. The auxiliary electrode is connected between the common electrode CE and the power line PL to supply a second power voltage VSS supplied from the power line PL to the common electrode CE, that is, the second electrode (for example, a cathode electrode) of the light emitting diode LD.

In the exemplary aspect, the protection transistor PT_2 may be connected between the common electrode CE and the auxiliary electrode AL_1 in series. For example, a first electrode (for example, a drain electrode) of the protection transistor PT_2 is connected to the common electrode CE and the second electrode (for example, a source electrode) may be connected to the auxiliary electrode AL_1.

As described above, the protection transistor PT_2 is connected between the common electrode CE and the auxiliary electrode AL_1 in series. Therefore, even though there is an auxiliary electrode AL_1 having a relatively low internal resistance RA_1, among the auxiliary electrodes AL_1 included in the pixels PX1_2 to PX6_2, a total resistance of the current path (for example, a current path of the driving current flowing in the light emitting diode LD) is increased according to the protection transistor PT_2 connected between the common electrode CE and the auxiliary electrode AL_1 in series. Therefore, the overcurrent may be suppressed from flowing in the corresponding current path.

Further, in the exemplary aspect, the protection transistor PT_2 may be diode-connected between the common electrode CE and the auxiliary electrode AL_1. For example, the gate electrode of the protection transistor PT_2 may be connected to the second electrode (for example, a source electrode). Therefore, the protection transistor PT_2 always operates in a saturated area so that a current path of the driving current which flows from the high potential voltage line configured to supply the first power voltage VDD (for example, a high potential power voltage) in the corresponding pixel PX1_2 to PX6_2 to the low potential voltage line (for example, the power line PL) configured to supply the second power voltage VSS (for example, a low potential power voltage) via the driving transistor DT and the light emitting diode LD may be ensured.

In the meantime, even though in FIG. 5A, it is illustrated that the protection transistors PT_2 are N-type transistors, the exemplary aspect of the present disclosure is not limited thereto. That is, the protection transistors PT_2 may be changed to the P-type transistors.

In the meantime, even though in FIG. 5A, it is described that the protection circuit OPC_2 includes one protection transistor PT_2 as a basic example, the exemplary aspect of the present disclosure is not limited thereto.

For example, further referring to FIG. 5B, in FIG. 5B, six pixels (for example, first to sixth pixels PX1_3 to PX6_3), among pixels according to the exemplary aspects of the present disclosure, are illustrated. For the convenience of description, hereinafter, the first to sixth pixels PX1_3 to PX6_3 are defined as a pixel group PXU_3.

In the meantime, for the convenience of description, in FIG. 5B, only a driving transistor DT, a light emitting diode LD, a common electrode CE, an auxiliary electrode AL_1, and a protection transistor PT_3, among configurations included in each of the first to sixth pixels PX1_3 to PX6_3, are illustrated.

Referring to FIGS. 1, 2, 3, and 5B, the pixel group PXU_3 according to the exemplary aspects of the present disclosure includes first to sixth pixels PX1_3 to PX6_3 and each of the first to sixth pixels PX1_3 to PX6_3 may include a driving transistor DT, a light emitting diode LD, a common electrode CE, and a protection circuit OPC_3.

The protection circuit OPC_3 may be connected (or coupled or disposed) between the common electrode CE and the power line PL (for example, a low potential voltage line) configured to supply a second power voltage VSS (for example, a low potential voltage). The protection circuit OPC_3 may include an auxiliary electrode AL_1 and the protection transistor PT_3 which is connected to the auxiliary electrode AL_1 in series. For example, the protection transistor PT_3 may be connected (for example, connected in series) between the common electrode CE and the auxiliary electrode AL_1.

In the exemplary aspect, the protection transistor PT_3 may include two serially connected sub protection transistors ST1_1 and ST2_1. For example, the first sub protection transistor ST1_1 is connected between the common electrode CE and the second sub protection transistor ST2_1 in series and the second sub protection transistor ST2_1 may be connected between the first sub protection transistor ST1_1 and the auxiliary electrode AL_1 in series. For example, a first electrode (for example, a drain electrode) of the first sub protection transistor ST1_1 is connected to the common electrode CE. A second electrode (for example, a source electrode) of the first sub protection transistor ST1 is connected to a first electrode (for example, a drain electrode) of the second sub protection transistor ST2. A second electrode (for example, a source electrode) of the second sub protection transistor ST2 may be connected to the auxiliary electrode AL_1.

Further, in one exemplary aspect, two serially connected sub protection transistors ST1_1 and ST2_1 which are included in the protection transistor PT_2 may be diode-connected.

As described above, the protection circuit OPC_3 includes two serially connected sub protection transistors ST1_1 and ST2_1 so that the overcurrent which may be generated in the corresponding current path may be effectively suppressed.

In the meantime, even though in FIG. 5B, it is described that the protection transistor PT_3 includes two serially connected sub protection transistors ST1_1 and ST2_1 as a basic example, the exemplary aspect of the present disclosure is not limited thereto. Therefore, the protection transistor PT_3 may be configured to include three or more serially connected sub protection transistors.

In the meantime, even though in FIG. 5B, it is illustrated that the protection transistor PT_3, for example, both the sub protection transistors ST1_1 and ST2_1 are N-type transistors, the exemplary aspect of the present disclosure is not limited thereto. That is, at least one of the sub protection transistors ST1_1 and ST2_1 of the protection transistor PT_3 may be changed to a P-type transistor.

Figure 6:
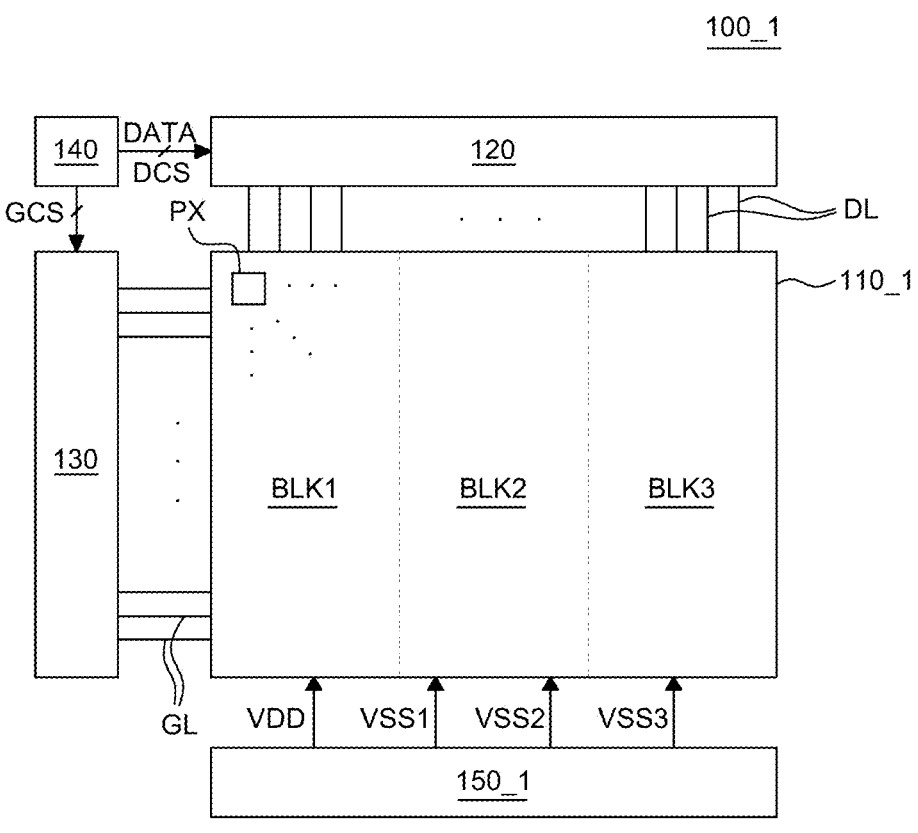
FIG. 6 is a block diagram illustrating a display device according to exemplary aspects of the present disclosure.

FIG. 6 is a block diagram illustrating a display device according to exemplary aspects of the present disclosure.

Figure 7:
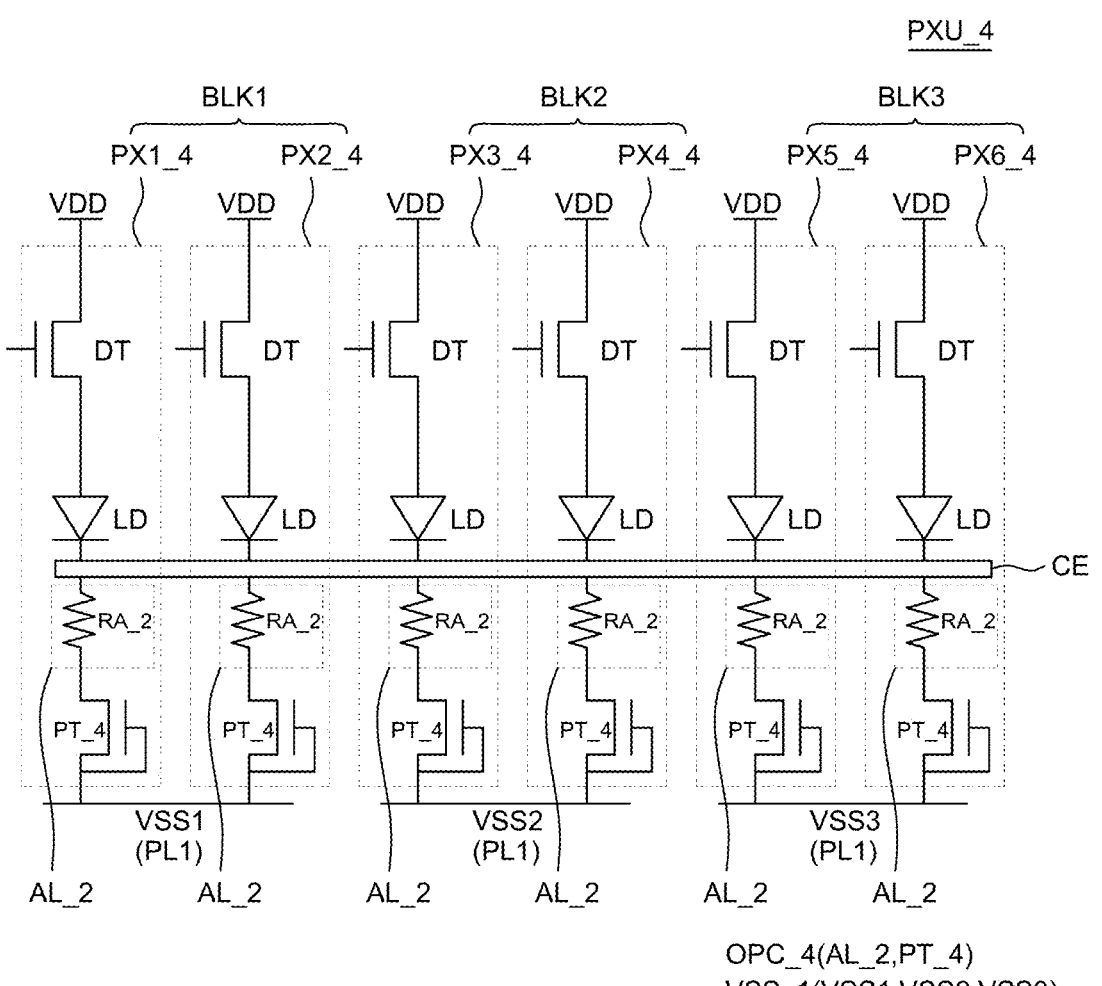
FIG. 7 is a circuit diagram illustrating a pixel group according to exemplary aspects of the present disclosure.

FIG. 7 is a circuit diagram illustrating a pixel group according to exemplary aspects of the present disclosure.

FIGS. 6 and 7 illustrate a modified exemplary aspect for the exemplary aspect of FIGS. 1 and 4A with regard to the display panel 110_1 which is partitioned into blocks BLK1, BLK2, and BLK3.

In the meantime, to avoid redundant description, in FIGS. 6 and 7, contents which do not overlap the description with reference to FIGS. 1 to 4A will be mainly described. A part which is not specifically described follows the above-described exemplary aspect and the same reference numeral denotes the same component and the like reference numeral denotes the like component.

First, referring to FIG. 6, a display device 100_1 according to exemplary aspects of the present disclosure may include a display panel 110_1, a data driver 120, a gate driver 130, a timing controller 140, and a power supply unit 150_1.

The display panel 110_1 (or a pixel unit or a display unit) may display an image. The display panel 110_1 may include various circuits, signal lines, and light emitting diodes disposed on the substrate. The display panel 110_1 may include a plurality of pixels PX which is divided by a plurality of data lines DL and a plurality of gate lines GL intersecting each other and is connected to the plurality of data lines DL and the plurality of gate lines GL.

In the meantime, pixels PX may be supplied with a first power voltage VDD (for example, a high potential power voltage) and a second power voltage VSS_1 (for example, a low potential power voltage) from the power supply unit 150_1. Here, the first power voltage VDD and the second power voltage VSS_1 are voltages required for the operation of the pixels PX. For example, the first power voltage VDD may have a voltage level higher than a voltage level of the second power voltage VSS_1.

In one exemplary aspect, the display panel 110_1 may be partitioned into a plurality of blocks BLK1, BLK2, and BLK3. For example, the display panel 110_1 may include one or more pixels PX. At this time, the blocks BLK1, BLK2, and BLK3 may include the same number of pixels PX. For example, as illustrated in FIG. 7, the blocks BLK1, BLK2, and BLK3 included in the display panel 110_1 may include the same number of pixels (for example, two pixels). For example, a first block BLK1 includes first and second pixels PX1_4 and PX2_4, a second block BLK2 includes third and fourth pixels PX3_4 and PX4_4, and a third block BLK3 may include fifth and sixth pixels PX5_4 and PX6_4.

However, this is just illustrative so that the exemplary aspect of the present disclosure is not limited thereto. For example, all or a part of the blocks BLK1, BLK2, and BLK3 may share one or more pixels PX and a part of the blocks BLK1, BLK2, and BLK3 may include pixels PX more than that of the other blocks.

Further, even though in FIG. 6, it is described that the display panel 110_1 is partitioned into three blocks BLK1, BLK2, and BLK3 as a basic example, the exemplary aspect of the present disclosure is not limited thereto. For example, the display panel 110_1 may be partitioned into two blocks or partitioned into four or more blocks.

The power supply unit 150_1 may supply a first power voltage VDD and a second power voltage VSS_1 for driving the pixel PX to the display panel 110_1.

In one exemplary aspect, the power supply unit 150_1 may supply the second power voltage VSS_1 for every block BLK1, BLK2, BLK3 of the display panel 110_1. For example, the power supply unit 150_1 supplies a first sub power voltage VSS1 to the first block BLK1 of the display panel 110_1, supplies a second sub power voltage VSS2 to the second block BLK2 of the display panel 110_1, and may supply a third sub power voltage VSS3 to the third block BLK3 of the display panel 110_1.

In the meantime, the sub power voltages VSS1, VSS2, and VSS3 supplied to the blocks BLK1, BLK2, and BLK3 may have different voltage levels, but this is just illustrative and the exemplary aspect of the present disclosure is not limited thereto. For example, at least some of the sub power voltages VSS1, VSS2, and VSS3 supplied to the blocks BLK1, BLK2, and BLK3 may have the same voltage level.

Next, further referring to FIG. 7, in FIG. 7, six pixels (for example, first to sixth pixels PX1_4 to PX6_4, among pixels according to the exemplary aspects of the present disclosure, are illustrated and for convenience of description, the first to sixth pixels PX1_4 to PX6_4 are defined as a pixel group PXU_4.

In the meantime, for the convenience of description, in FIG. 7, only a driving transistor DT, a light emitting diode LD, a common electrode CE, an auxiliary electrode AL_2, and a protection transistor PT_4, among configurations included in each of the first to sixth pixels PX1_4 to PX6_4, are illustrated.

Referring to FIGS. 6 and 7, the pixel group PXU_4 according to the exemplary aspects of the present disclosure includes first to sixth pixels PX1_4 to PX6_4 and each of the first to sixth pixels PX1_4 to PX6_4 may include a driving transistor DT, a light emitting diode LD, a common electrode CE, and a protection circuit OPC_4.

As described above, the light emitting diode LD included in each of the first to sixth pixels PX1_4 to PX6_4 may share the common electrode CE as a second electrode (for example, a cathode electrode). For example, at least a part of the common electrode CE may configure a second electrode (for example, a cathode electrode) of the light emitting diode LD included in each pixel PX1_4 to PX6_4.

In the exemplary aspect, pixels PX1_4 to PX6_4 included in each block BLK1, BLK2, BLK3 may be supplied with the second power voltage VSS_1 (for example, a low potential voltage) through different sub power voltage lines PL1, PL2, and PL3. For example, the first and second pixels PX1_4 and PX2_4 included in the first block BLK1 are supplied with a first sub power voltage VSS1 through the first sub power voltage line PL1. The third and fourth pixels PX3_4 and PX4_4 included in the second block BLK2 are supplied with a second sub power voltage VSS2 through the second sub power voltage line PL2. The fifth and sixth pixels PX5_4 and PX6_4 included in the third block BLK3 may be supplied with a third sub power voltage VSS3 through the third sub power voltage line PL3.

The protection circuit OPC_4 may be connected (or coupled or disposed) between the common electrode CE and the power line (for example, a low potential voltage line) configured to supply a second power voltage VSS_1 (for example, a low potential voltage). For example, the protection circuit OPC_4 included in the pixels PX1_4 and PX2_4 of the first block BLK1 is connected (or coupled or disposed) between the common electrode CE and the first sub power voltage line PL1. The protection circuit OPC_4 included in the pixels PX3_4 and PX4_4 of the second block BLK2 is connected (or coupled or disposed) between the common electrode CE and the second sub power voltage line PL2. The protection circuit OPC_4 included in the pixels PX5_4 and PX6_4 of the third block BLK3 may be connected (or coupled or disposed) between the common electrode CE and the third sub power voltage line PL3.

In one exemplary aspect, the protection circuit OPC_4 may include an auxiliary electrode AL_2 and a protection transistor PT_4 which is connected to the auxiliary electrode AL_2 in series.

The auxiliary electrode AL_2 (or auxiliary line) may be connected (or coupled or disposed) between the second electrode of the light emitting diode LD, for example, the common electrode CE and the power line (for example, the first sub power voltage line PL1, the second sub power voltage line PL2, or the third sub power voltage line PL3).

For example, the auxiliary electrode AL_2 included in the pixels PX1_4 and PX2_4 of the first block BLK1 may be connected (or coupled or disposed) between the second electrode of the light emitting diode LD, for example, the common electrode CE and the first sub power voltage line PL1. For example, one end of the auxiliary electrode AL_2 included in the pixels PX1_4 and PX2_4 of the first block BLK1 is connected to the second electrode of the light emitting diode LD (for example, the common electrode CE). The other end of the auxiliary electrode AL_2 may be connected to the first sub power voltage line PL1 via the protection transistor PT_4.

As another example, the auxiliary electrode AL_2 included in the pixels PX3_4 and PX4_4 of the second block BLK2 may be connected (or coupled or disposed) between the second electrode of the light emitting diode LD, for example, the common electrode CE and the second sub power voltage line PL2. For example, one end of the auxiliary electrode AL_2 included in the pixels PX3_4 and PX4_4 of the second block BLK2 is connected to the second electrode of the light emitting diode LD (for example, the common electrode CE). The other end of the auxiliary electrode AL_2 may be connected to the second power line PL via the protection transistor PT_4.

As still another example, the auxiliary electrode AL_2 included in the pixels PX5_4 and PX6_4 of the third block BLK3 may be connected (or coupled or disposed) between the second electrode of the light emitting diode LD, for example, the common electrode CE and the third sub power voltage line PL3. For example, one end of the auxiliary electrode AL_2 included in the pixels PX5_4 and PX6_4 of the third block BLK3 may be connected to the second electrode of the light emitting diode LD (for example, the common electrode CE). The other end of the auxiliary electrode AL_2 may be connected to the third sub power voltage line PL3 via the protection transistor PT_4.

The auxiliary electrode AL_2 may be provided with a material having a high conductivity, such as metal or conductive oxide. For example, the auxiliary electrode AL_2 may be formed by a single layer or a multilayer including aluminum (Al), copper (Cu), or titanium (Ti). In some exemplary aspect, the auxiliary electrode AL_2 may be provided as a triple layer of titanium, aluminum, and titanium (Ti/Al/Ti) which are sequentially disposed. However, the auxiliary electrode AL_2 is not limited thereto and may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof.

As described above, each pixel PX1_4 to PX6_4 (for example, the protection circuit OPC_4) includes an auxiliary electrode AL-2 to minimize (for example, remove) a deviation of voltage drop (IR drop) for every display area DA which may be caused by sharing the common electrode CE by the above-described light emitting diodes LD. The auxiliary electrode is connected between the common electrode CE and the power line (for example, the first sub power voltage line PL1, the second sub power voltage line PL2, or the third sub power voltage line PL3) to supply a second power voltage VSS_1 supplied from the power line (for example, the first sub power voltage line PL1, the second sub power voltage line PL2, or the third sub power voltage line PL3) to the common electrode CE, that is, the second electrode (for example, a cathode electrode) of the light emitting diode LD.

In the meantime, even though the pixels PX1_4 to PX6_4 (for example, the protection circuit OPC_4) include the auxiliary electrode AL_2 to minimize the deviation of the voltage drop (IR drop) for every display area DA, the voltage drop (IR drop) for every display area DA may not be completely compensated.

Therefore, in the exemplary aspect, the sub power voltages VSS1, VSS2, and VSS3 supplied to the sub power voltage lines PL1, PL2, and PL3 may have different voltage levels. For example, voltage levels of the sub power voltages VSS1, VSS2, and VSS3 supplied to the sub power voltage lines PL1, PL2, and PL3 may be set in consideration of the voltage drop (IR drop) for every display area DA to flow the driving current with the same current amount in the pixels PX1_4 to PX6_4 included in the blocks BLK1, BLK2, and BLK3. For example, in a block (for example, a second block BLK2) corresponding to a center of the display area DA, among the blocks BLK1, BLK2, and BLK3 of the display area DA, a distance from both sides of the display area DA in which the power line is disposed is relatively long. Therefore, the voltage drop (IR drop) of the block (for example, the second block BLK2) corresponding to the center of the display area DA may be larger than the voltage drop (IR drop) of the blocks (for example, the first and third blocks BLK1 and BLK3) corresponding to both sides of the display area DA. Therefore, an absolute value of the second power voltage (for example, the second sub power voltage VSS2) supplied through the power line (for example, the second sub power voltage line PL2) corresponding to a block (for example, the second block BLK2) corresponding to the center of the display area DA, among the blocks BLK1, BLK2, and BLK3, may be set to be larger than an absolute value of the second power voltage (for example, the first sub power voltage VSS1 and/or the third sub power voltage VSS3) supplied through the power line (for example, the first sub power voltage line PL1 and/or the third sub power voltage line PL3) corresponding to a block (for example, the first block BLK1 and/or the third block BLK3) corresponding to both sides of the display area DA, among the blocks BLK1, BLK2, and BLK3. Therefore, the voltage drop (IR drop) for every display area DA may be effectively compensated.

In one exemplary aspect, the protection transistor PT_4 may be connected between the auxiliary electrode AL_2 and the power line (for example, the first sub power voltage line PL1, the second sub power voltage line PL2 or the third sub power voltage line PL3) in series.

For example, the first electrode (for example, a drain electrode) of the protection transistor PT_4 included in the pixels PX1_4 and PX2_4 of the first block BLK1 is connected to the auxiliary electrode AL_2 and the second electrode (for example, a source electrode) may be connected to the first sub power voltage line PL1.

As another example, the first electrode (for example, a drain electrode) of the protection transistor PT_4 included in the pixels PX3_4 and PX4_4 of the second block BLK2 is connected to the auxiliary electrode AL_2 and the second electrode (for example, a source electrode) may be connected to the second sub power voltage line PL2.

As still another example, the first electrode (for example, a drain electrode) of the protection transistor PT_4 included in the pixels PX5_4 and PX6_4 of the third block BLK3 is connected to the auxiliary electrode AL_2 and the second electrode (for example, a source electrode) may be connected to the third sub power voltage line PL3.

As described above, the protection transistor PT_4 is connected between the auxiliary electrode AL_2 and the power line (for example, the first sub power voltage line PL1, the second sub power voltage line PL2 or the third sub power voltage line PL3) in series. Therefore, even though there is an auxiliary electrode AL_2 having a relatively low internal resistance RA_2, among the auxiliary electrodes AL_2 included in the pixels PX1_4 to PX6_4, a total resistance of the current path (for example, a current path of the driving current flowing the light emitting diode LD) is increased according to the protection transistor PT_4 connected between the auxiliary electrode AL_2 and the power line (for example, the first sub power voltage line PL1, the second sub power voltage line PL2 or the third sub power voltage line PL3) in series. Therefore, the overcurrent is suppressed from flowing in the corresponding current path.

Further, in one exemplary aspect, the protection transistor PT_4 may be diode-connected between the auxiliary electrode AL_2 and the power line (for example, the first sub power voltage line PL1, the second sub power voltage line PL2 or the third sub power voltage line PL3). For example, the gate electrode of the protection transistor PT_4 may be connected to the second electrode (for example, a source electrode). Therefore, the protection transistor PT_4 always operates in a saturated area so that a current path of the driving current which flows from the high potential voltage line configured to supply the first power voltage VDD (for example, a high potential power voltage) in the corresponding pixel PX1_4 to PX6_4 to the low potential voltage line (for example, the power line) configured to supply the second power voltage VSS_1 (for example, a low potential power voltage) via the driving transistor DT and the light emitting diode LD may be ensured.

In the meantime, even though in FIG. 7, it has been described that the protection circuit OPC_4 includes one protection transistor PT_4 as a basic example, the exemplary aspect of the present disclosure is not limited thereto. As described with reference to FIGS. 4B and 5B, the protection transistor PT_4 may be configured to include two or more serially connected sub protection transistors.

In the meantime, even though in FIG. 7, it is illustrated that the protection transistors PT_4 are N-type transistors, the exemplary aspect of the present disclosure is not limited thereto. That is, the protection transistors PT_4 may be changed to the P-type transistors.

As described above, in the pixel and the display device including the same according to exemplary aspects of the present disclosure, the pixel may include a protection circuit (for example, overcurrent protection circuit) connected (or coupled or disposed) between a light emitting diode and a power line (for example, a low potential voltage line) configured to supply a second power voltage (a low potential voltage).

Here, the protection circuit may include an auxiliary electrode (auxiliary line) which is connected between a second electrode (cathode electrode) of a light emitting diode which is formed as a common electrode and a power line (for example, a low potential voltage line) configured to supply a second power voltage (low potential voltage). The auxiliary electrode supplies a second power voltage (low potential voltage) supplied from the power line (for example, a low potential voltage line) to the second electrode (cathode electrode) of the light emitting diode. Therefore, the voltage drop (IR drop) which may be generated according to a resistance of the second electrode (cathode electrode) of the light emitting diode which is formed as a common electrode is minimized (for example, removed) and thus the resulting luminance irregularity problem may be solved.

Further, the protection circuit may further include a protection transistor which is connected to the auxiliary electrode in series. Therefore, the overcurrent which may occur according to an internal resistance difference of the auxiliary electrode and the resulting burnt defect may be suppressed.

The pixel according to various exemplary aspects of the present disclosure will be described as follows:

To achieve the above-described, a pixel according to an exemplary aspect of the present disclosure includes a light emitting diode which includes a first electrode and a second electrode, a driving transistor which is connected between a second node corresponding to the first electrode of the light emitting diode and a third node corresponding to a first power voltage line configured to supply a first power voltage and generates a driving current flowing to a second power voltage line configured to supply a second power voltage through the light emitting diode from the first power voltage line, a switching transistor which is connected between the first node corresponding to a gate electrode of the driving transistor and a data line and is turned on in response to a gate signal which is supplied to a gate line, a storage capacitor connected between the first node and the second node; and a protection circuit which is connected between the second electrode of the light emitting diode and the second power voltage line, and the protection circuit may include an auxiliary electrode and a protection transistor which are connected in series.

In one exemplary aspect, the protection transistor may be diode-connected.

In one exemplary aspect, the auxiliary electrode is connected between the second electrode of the light emitting diode and the second power voltage line and the protection transistor may be connected between the auxiliary electrode and the second power voltage line.

In one exemplary aspect, the protection transistor may include a first sub protection transistor which is connected between the auxiliary electrode and the second power voltage line and is diode-connected and a second sub protection transistor which is connected between the first sub protection transistor and the second power voltage line and is diode-connected.

In one exemplary aspect, the auxiliary electrode is connected between the second electrode of the light emitting diode and the second power voltage line and the protection transistor may be connected between the second electrode of the light emitting diode and the auxiliary electrode.

In one exemplary aspect, the protection transistor may include a first sub protection transistor which is connected between the second electrode of the light emitting diode and the auxiliary electrode and is diode-connected and a second sub protection transistor which is connected between the first sub protection transistor and the auxiliary electrode and is diode-connected.

In one exemplary aspect, the protection transistor may be an N-type transistor.

To achieve the above-described, a display device according to an exemplary aspect of the present disclosure comprise a display panel including a plurality of pixels each connected to a data line, a gate line, a first power voltage line, and a second power voltage line; a gate driver configured to supply a gate signal to the gate line; a data driver configured to supply a data signal to the data line; and a power supply unit configured to supply a first power voltage to the first power voltage line and supplies a second power voltage to the second power voltage line, wherein each of the plurality of pixels may include a light emitting diode which includes a first electrode and a second electrode; a driving transistor which is connected between a second node corresponding to the first electrode of the light emitting diode and a third node corresponding to the first power voltage line configured to supply a first power voltage and generates a driving current flowing to the second power voltage line configured to supply a second power voltage through the light emitting diode from the first power voltage line; a switching transistor which is connected between a first node corresponding to a gate electrode of the driving transistor and the data line and is turned on in response to the gate signal; a storage capacitor connected between the first node and the second node; and a protection circuit which is connected between the second electrode of the light emitting diode and the second power voltage line, and the protection circuit includes an auxiliary electrode and a protection transistor which are connected in series.

In one exemplary aspect, the protection transistor may be diode-connected.

In one exemplary aspect, the auxiliary electrode is connected between the second electrode of the light emitting diode and the second power voltage line and the protection transistor may be connected between the auxiliary electrode and the second power voltage line.

In one exemplary aspect, the protection transistor may include a first sub protection transistor which is connected between the auxiliary electrode and the second power voltage line and is diode-connected and a second sub protection transistor which is connected between the first sub protection transistor and the second power voltage line and is diode-connected.

In one exemplary aspect, the auxiliary electrode is connected between the second electrode of the light emitting diode and the second power voltage line and the protection transistor may be connected between the second electrode of the light emitting diode and the auxiliary electrode.

In one exemplary aspect, the protection transistor may include a first sub protection transistor which is connected between the second electrode of the light emitting diode and the auxiliary electrode and is diode-connected and a second sub protection transistor which is connected between the first sub protection transistor and the auxiliary electrode and is diode-connected.

In one exemplary aspect, the protection transistor may be an N-type transistor.

In one exemplary aspect, the display panel may be partitioned into a first block and a second block each including at least one of the plurality of pixels.

In one exemplary aspect, the second power voltage line may include a first sub power voltage line and a second sub power voltage line, and the power supply unit supplies a first sub power voltage to at least one pixel included in the first block through the first sub power voltage line and supplies a second sub power voltage to at least one pixel included in the second block through the second sub power voltage line.

In one exemplary aspect, a voltage level of the first sub power voltage may be different from a voltage level of the second sub power voltage.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. All the technical concepts in the equivalent scope of the present disclosure should be construed as falling within the scope of the present disclosure.

What is claimed is:

1. A pixel comprising:

a light emitting diode including a first electrode and a second electrode;

a driving transistor connected between a second node corresponding to the first electrode of the light emitting diode and a third node corresponding to a first power voltage line configured to supply a first power voltage and generating a driving current flowing to a second power voltage line configured to supply a second power voltage through the light emitting diode from the first power voltage line;

a switching transistor connected between a first node corresponding to a gate electrode of the driving transistor and a data line and turned on in response to a gate signal which is supplied to a gate line;

a storage capacitor connected between the first node and the second node; and a protection circuit connected between the second electrode of the light emitting diode and the second power voltage line, wherein the protection circuit includes an auxiliary electrode and a protection transistor connected with each other in series and wherein the protection transistor includes a first electrode connected to the light emitting diode, a second electrode connected to the second power voltage line and a gate electrode directly connected to the second electrode of the protection transistor.

2. The pixel according to claim 1, wherein the protection transistor is a diode-connected transistor.

3. The pixel according to claim 1, wherein the auxiliary electrode is connected between the second electrode of the light emitting diode and the second power voltage line and the protection transistor is connected between the auxiliary electrode and the second power voltage line.

4. The pixel according to claim 3, wherein the protection transistor includes:

a first sub protection transistor connected between the auxiliary electrode and the second power voltage line and being diode-connected; and a second sub protection transistor connected between the first sub protection transistor and the second power voltage line and being diode-connected.

5. The pixel according to claim 1, wherein the auxiliary electrode is connected between the second electrode of the light emitting diode and the second power voltage line and the protection transistor is connected between the second electrode of the light emitting diode and the auxiliary electrode.

6. The pixel according to claim 5, wherein the protection transistor includes:

a first sub protection transistor which is connected between the second electrode of the light emitting diode and the auxiliary electrode and is diode-connected; and a second sub protection transistor which is connected between the first sub protection transistor and the auxiliary electrode and is diode-connected.

7. The pixel according to claim 1, wherein the protection transistor is an N-type transistor.

8. A display device, comprising:

a display panel including a plurality of pixels each connected to a data line, a gate line, a first power voltage line, and a second power voltage line;

a gate driver configured to supply a gate signal to the gate line;

a data driver configured to supply a data signal to the data line; and a power supply unit configured to supply a first power voltage to the first power voltage line and supplies a second power voltage to the second power voltage line, wherein each of the plurality of pixels includes:

a light emitting diode which includes a first electrode and a second electrode;

a driving transistor connected between a second node corresponding to the first electrode of the light emitting diode and a third node corresponding to the first power voltage line configured to supply a first power voltage and generating a driving current flowing to the second power voltage line configured to supply a second power voltage through the light emitting diode from the first power voltage line;

a switching transistor connected between a first node corresponding to a gate electrode of the driving transistor and the data line and is turned on in response to the gate signal;

a storage capacitor connected between the first node and the second node; and a protection circuit connected between the second electrode of the light emitting diode and the second power voltage line, wherein the protection circuit includes an auxiliary electrode and a protection transistor which are connected in series, and wherein the protection transistor includes a first electrode connected to the light emitting diode, a second electrode connected to the second power voltage line and a gate electrode directly connected to the second electrode of the protection transistor.

9. The display device according to claim 8, wherein the protection transistor is a diode-connected transistor.

10. The display device according to claim 8, wherein the auxiliary electrode is connected between the second electrode of the light emitting diode and the second power voltage line and the protection transistor is connected between the auxiliary electrode and the second power voltage line.

11. The display device according to claim 10, wherein the protection transistor includes:

a first sub protection transistor which is connected between the auxiliary electrode and the second power voltage line and is diode-connected; and a second sub protection transistor which is connected between the first sub protection transistor and the second power voltage line and is diode-connected.

12. The display device according to claim 8, wherein the auxiliary electrode is connected between the second electrode of the light emitting diode and the second power voltage line and the protection transistor is connected between the second electrode of the light emitting diode and the auxiliary electrode.

13. The display device according to claim 12, wherein the protection transistor includes:

a first sub protection transistor connected between the second electrode of the light emitting diode and the auxiliary electrode and being diode-connected; and a second sub protection transistor connected between the first sub protection transistor and the auxiliary electrode and being diode-connected.

14. The display device according to claim 8, wherein the protection transistor is an N-type transistor.

15. The display device according to claim 8, wherein the display panel is partitioned into a first block and a second block each including at least one of the plurality of pixels.

16. The display device according to claim 15, wherein the second power voltage line includes a first sub power voltage line and a second sub power voltage line, and wherein the power supply unit supplies a first sub power voltage to at least one pixel included in the first block through the first sub power voltage line and supplies a second sub power voltage to at least one pixel included in the second block through the second sub power voltage line.

17. The display device according to claim 16, wherein a voltage level of the first sub power voltage is different from a voltage level of the second sub power voltage.

18. A display device, comprising:

a display area displaying an image and a non-display area located outside the display area and accommodating various signal lines or pads;

a light emitting diode including a common electrode and disposed in the display area;

a driving circuit connected to the light emitting diode; and a protection circuit configured to compensate for a deviation of a voltage drop for the display area and connected between the common electrode and a low potential power voltage line, wherein the protection circuit includes an auxiliary electrode and at least one protection transistor connected with each other in series, and wherein the auxiliary electrode is connected between the common electrode and the low potential power voltage line, and the protection transistor is connected between the auxiliary electrode and the low potential power voltage line, and wherein the protection transistor includes a first electrode connected to the light emitting diode, a second electrode connected to the low potential power voltage line and a gate electrode directly connected to the second electrode of the protection transistor.

19. The display device according to claim 18, wherein the display area is divided into at least two display areas.

20. The display device according to claim 19, further comprising a power supply configured to supply the low potential power voltage to the at least two display areas with an adjusted voltage level in accordance with the deviation of the voltage drop for the at least two display areas.

* * * * *